United States Patent
Bolen et al.

(10) Patent No.: US 7,381,064 B2
(45) Date of Patent: Jun. 3, 2008

(54) FLEXIBLE FLAT CABLE TERMINATION STRUCTURE FOR A CLOCKSPRING

(75) Inventors: Pat A. Bolen, Carthage, IL (US); Brent E. Henderson, Ursa, IL (US)

(73) Assignee: Methode Electronics, Inc., Chicago, IL (US)

( * ) Notice: Subject to any disclaimer, the term of this patent is extended or adjusted under 35 U.S.C. 154(b) by 0 days.

(21) Appl. No.: 10/721,168

(22) Filed: Nov. 26, 2003

(65) Prior Publication Data

US 2005/0048809 A1    Mar. 3, 2005

Related U.S. Application Data

(60) Provisional application No. 60/497,563, filed on Aug. 26, 2003.

(51) Int. Cl.
    *H01R 12/00*    (2006.01)

(52) U.S. Cl. ................... 439/67; 439/77; 174/117 FF

(58) Field of Classification Search ............... 439/15, 439/67, 75, 77, 329, 404, 947; 174/117 FF, 174/254

See application file for complete search history.

(56) References Cited

U.S. PATENT DOCUMENTS

| | | | | |
|---|---|---|---|---|
| 5,194,010 A * | 3/1993 | Dambach et al. | ............ | 439/79 |
| 5,230,713 A * | 7/1993 | Schauer | ............ | 29/856 |
| 5,735,697 A * | 4/1998 | Muzslay | ............ | 439/83 |
| 6,032,359 A * | 3/2000 | Carroll | ............ | 29/881 |
| 6,299,466 B1 * | 10/2001 | Bolen et al. | ............ | 439/164 |
| 6,439,928 B1 * | 8/2002 | Akama et al. | ............ | 439/608 |
| 2003/0060083 A1 * | 3/2003 | Akama et al. | ............ | 439/608 |
| 2005/0048809 A1 * | 3/2005 | Bolen et al. | ............ | 439/67 |
| 2006/0089012 A1 * | 4/2006 | Bolen et al. | ............ | 439/67 |

* cited by examiner

*Primary Examiner*—James Harvey
(74) *Attorney, Agent, or Firm*—Blank Rome LLP

(57) ABSTRACT

The present invention is directed towards a flexible flat cable of a vehicular clockspring whose conductors are directly attached to the contacts of a mounting header. The flat cable comprises a series of conductors "printed" in-between a pair of insulating layers. The conductors are directly connected to the contacts of a mounting header, which partially form the connection module of a clockspring. Other devices or cables within the vehicle can than quickly mate to the clockspring connection module, via a corresponding connector. This method of termination is in contrast to prior art clockspring cables which typically weld their cable conductors to rigid printed circuit boards or overmolded metallic insert grids.

9 Claims, 6 Drawing Sheets

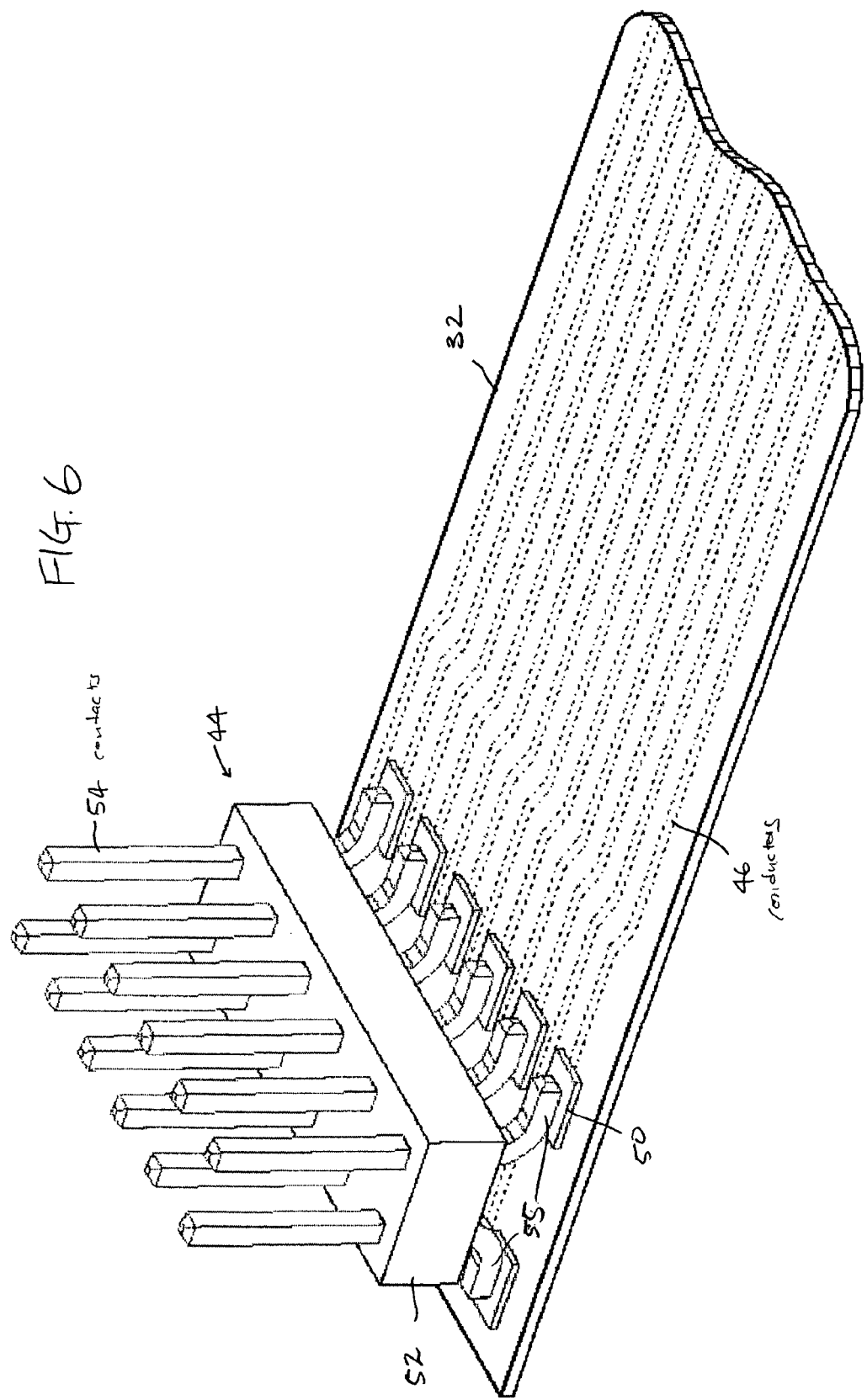

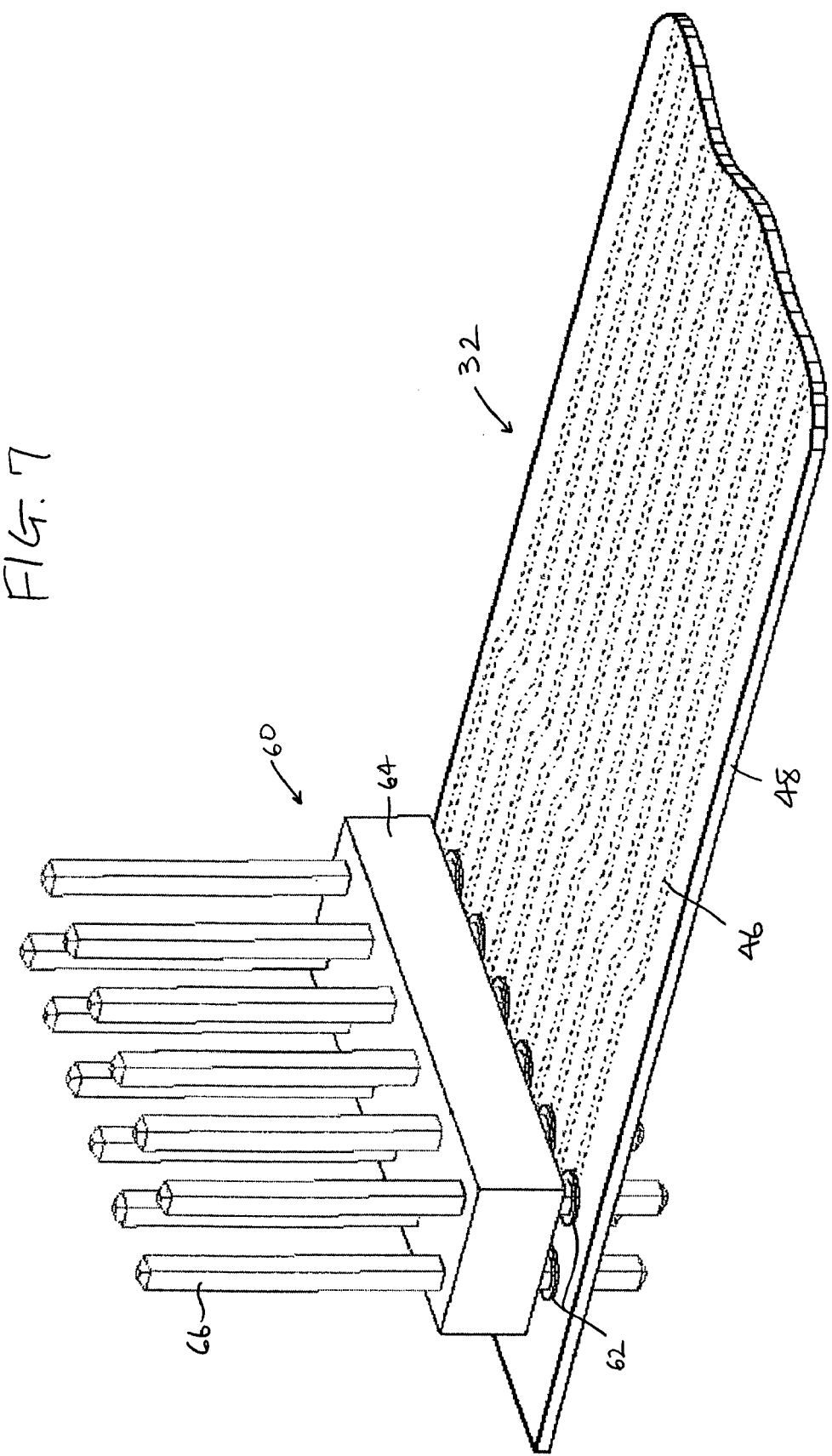

FLEXIBLE FLAT CABLE TERMINATION STRUCTURE FOR A CLOCKSPRING

CROSS-REFERENCE TO RELATED APPLICATIONS

This application claims priority to U.S. Provisional Application Ser. No. 60/497,563 filed Aug. 26, 2003.

FIELD OF INVENTION

The present invention relates to a flexible flat cable for use in a clockspring, the flat cable having conductors printed onto a base insulating layer and being directly terminated at a surface mount header located in a clockspring connection module.

BACKGROUND OF THE INVENTION

A majority of automobiles today utilize airbag crash systems. An airbag is typically located on the steering wheel facing the driver and must be in continuous electrical connection with sensors in the car body. The sensors provide an electrical signal to the airbag crash assembly which instantly inflates the airbag in the event of a crash. Clocksprings are found in virtually every vehicle to electrically connect rotating devices in the steering column to stationary components in other parts of the vehicle.

There are generally two types of clocksprings designs, the coil and the "loop-back" design. In the coil design, long lengths of flat cable (typically 6 to 13 feet) are wrapped around a central hub of a clockspring, in a coil-type fashion. In a loop-back design, a roller and carrier mechanism loop a flat cable (typically 2 to 3 feet) back onto itself inside the clockspring.

In both types of clocksprings, the flat cable comprises a series of parallel conductors sandwiched between two insulating layers of plastic or similar material. The flat cable is terminated by welding the flat cable's conductors to a rigid circuit board or overmolded metallic insert grid.

FIGS. 1A-1C show a prior art flat cable 10 and flat cable termination structure. FIG. 1A shows a rigid circuit board 11 having ten (10) contacts 12 thereon. The contacts 12 are connected to metal conductors 14 traced onto the circuit board 10, which eventually form metal leads 16.

FIGS. 1B and IC show a top and perspective view, respectively, of the flat cable 10 welded to the metal leads 16. The flat cable 10 is generally formed by sandwiching a series of conductors 20 between two insulating layers of plastic or similar material. The insulating layers in FIGS. 1B and 1C are transparent so that the cable conductors 20 can be seen. The insulating layers have an adhesive bonding agent on their interior sides which bond to each other and the cable conductors 20. The ends of the flat cable 10 are stripped to expose the cable conductors 20 therein, which are then welded to the metal leads 16.

The flat cable and flat cable termination structure of the prior art suffers from the disadvantage that it requires the cable conductors 20 and the metal leads 16 to be spaced apart a certain pitch, resulting in larger clocksprings. Additionally, the cable conductors 20 are attached to the contacts 12 via the circuit board 11, adding a structural component between the flat cable 10 and the contacts 12.

In view of the foregoing, it would be advantageous to provide a flexible flat cable for a clockspring having conductors "printed" or "screened" onto a flat cable in order to increase the conductor density (i.e. the amount of conductors in a given space) of the cable. It would further be advantageous to provide a flat cable termination structure which eliminated the circuit board, and directly connected the conductors of the flat cable to the contacts of a connector, thereby eliminating the need for a circuit board or other intermediary connecting device.

SUMMARY OF THE INVENTION

The present invention is directed towards a flexible flat cable of a vehicular clockspring whose conductors are directly attached to the contacts of a mounting header. The flat cable comprises a series of conductors located between a pair of insulating layers, with the conductors "printed" or "screened" onto one of the insulating layers.

The ends of the cable are terminated at a mounting header having contacts thereon. The mounting header is incorporated into a connection module for the clockspring so that the contacts serve as the male ends of the connection module. Other devices or cables which connect to the clockspring can than be quickly mated to the connection module, via a corresponding female connector. This method of termination is in contrast to prior art clockspring cables which typically weld their cable conductors to rigid printed circuit boards or overmolded metallic insert grids.

The flexible flat cable of the present invention improves upon the prior art by printing or screening the conductors onto the flat cable, which allows for greater conductor density. In this manner, same-size cables are able to carry larger amounts of data or similarly, the same amount of data can be carried in smaller cables.

Additionally, the present invention eliminates the use of the printed circuit board and insert grid by directly attaching the conductors of the cable to the male contacts in the mounting header. This increases the reliability of the clockspring by eliminating interconnects, and decreases the cost of manufacturing the clockspring by reducing the number of components.

BRIEF DESCRIPTION OF THE DRAWINGS

FIG. 6 shows a perspective view of a terminal end of the flexible flat cable using a first embodiment of present invention; and FIG. 7 shows a perspective view of a terminal end of the flexible flat cable using a second embodiment of present invention.

DETAILED DESCRIPTION OF THE PREFERRED EMBODIMENT

Referring now to the several drawing figures in which identical elements are numbered identically throughout, a description of the preferred embodiment of the present invention will be provided.

Figure 1B:
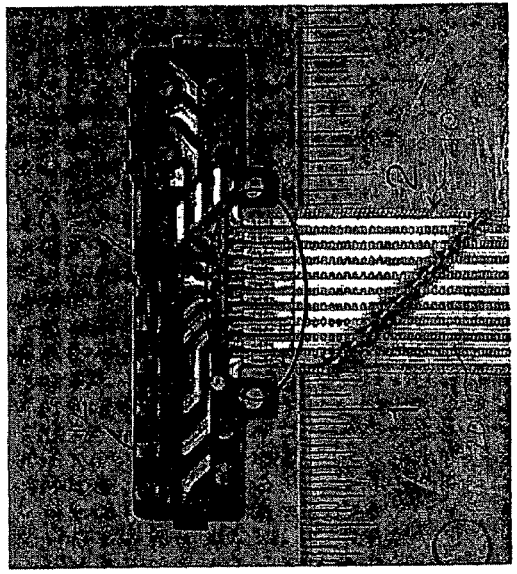
FIG. 1B shows a top view of a prior art flat cable attached to the circuit board of FIG. 1A.
Figure 1C:
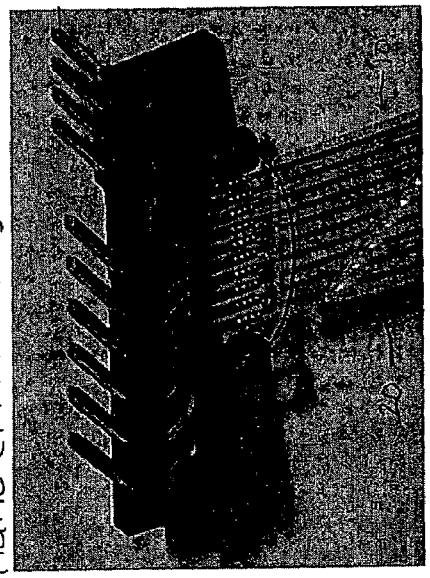
FIG. 1C shows a perspective view of the prior art flat cable and circuit board of FIG. 1B.
Figure 1A:
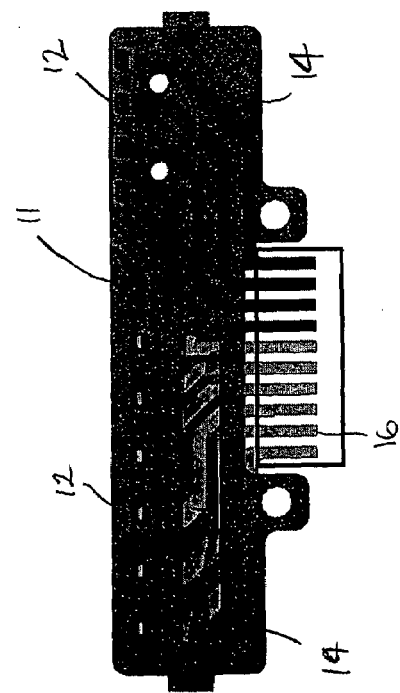
FIG. 1A shows a top view of a prior art circuit board used in a clockspring.
Figure 2:
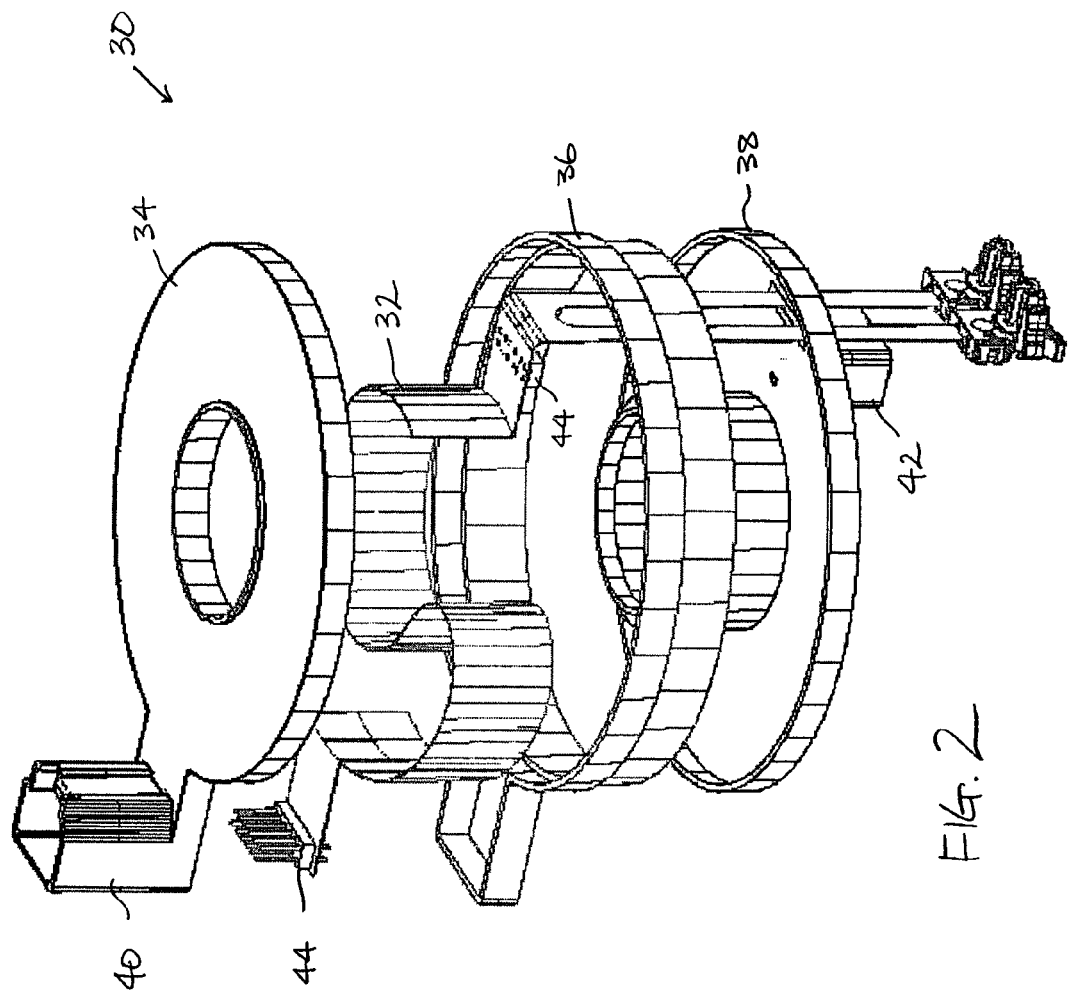
FIG. 2 shows an exploded view of a clockspring using the flexible flat cable of the present invention.

FIG. 2 shows a "loop-back" type clockspring 30 using a flat cable 32 and flat cable termination structure of the present invention. The clockspring 30 includes a housing structure having a top cover 34, an intermediate cover 36, and a bottom cover 38. The top and bottom covers 34 and 38 both have connection modules 40 and 42, respectively, for holding a mounting header 44 attached to the flat cable 32, as explained later in greater detail.

The flat cable 32 comprises a series of conductors 46 placed between a pair of insulating layers 48. The conductors 46 are "printed" onto one of the insulating layer 48 so that the conductors 46 reside on an interior surface of the insulating layer with minimal depth. This allows the flat cable 32 to remain flatter than prior art clockspring cables. The term "printed" is used herein to describe any one of a number of known methods for placing a thin layer of conductive material onto a surface, including but not limited to, printing, screening, and etching conductive material onto the insulating layer. The ends of the conductors 46 are terminated at pads 50, preferably solder pads, for connection to the mounting header 44 (see FIG. 6).

FIGS. 3-6 show a first embodiment of the flat cable termination structure of the present invention using a surface mount type mounting header 44. The mounting header 44 comprises a mounting block 52 securing a plurality of contacts 54. The ends of the contacts 55 are soldered to the pads 50, with the ends of the contacts curved to provide a greater surface area for attachment to the pads 50.

The contacts 54 of the mounting header 44 provide the male contacts for the connection modules 40 and 42. Other vehicle components are attached to the connection modules 40 and 42, via female connection modules (not shown), which can be quickly mated to the male connection modules 40 and 42, as is well known in the art. For example, the connection module 40 on the top cover 34 can connect to rotating electrical devices on the steering wheel while the connection module 42 on the bottom cover 38 connects through the steering column to stationary electrical device in the vehicle.

Figure 3:
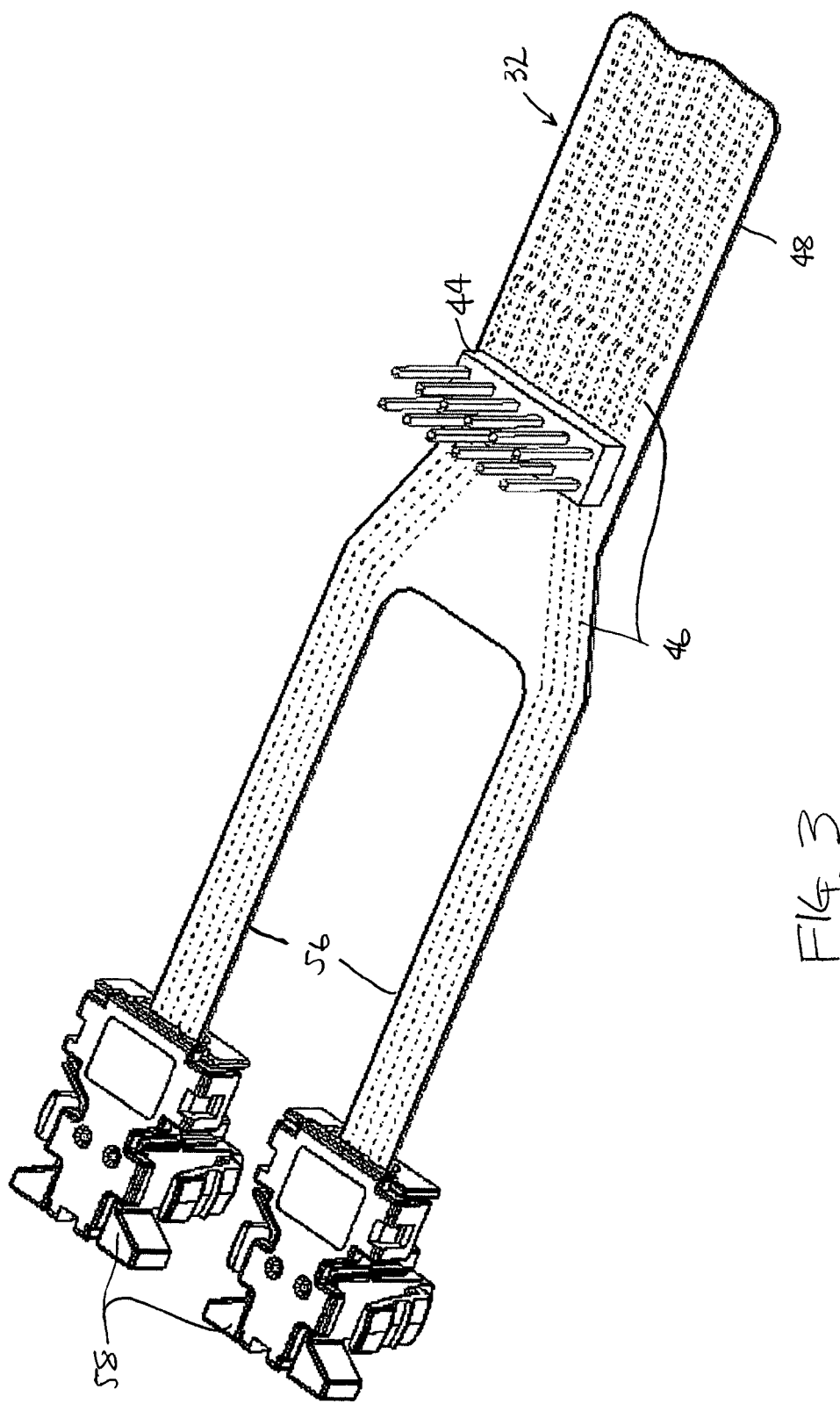
FIG. 3 shows a perspective view of one end of the flexible flat cable of the present invention.
Figure 4:
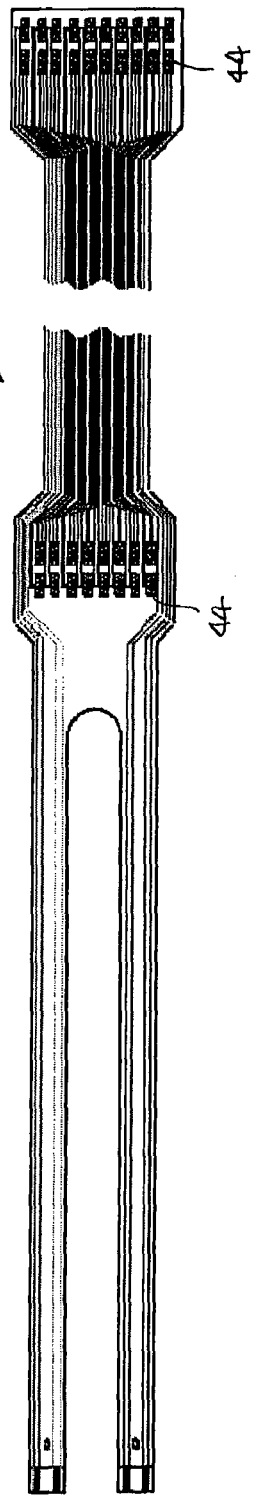
FIG. 4 shows a top view of the flexible flat cable of the present invention.
Figure 5:
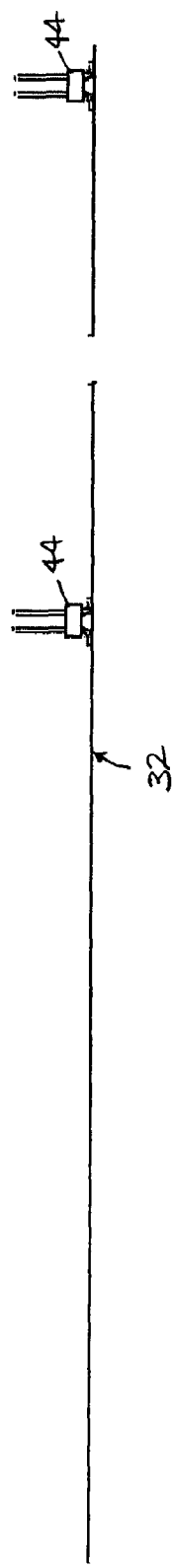
FIG. 5 shows a side view of the flexible flat cable of the present invention.

A further feature of the invention is that the flat cable 32 contains two extensions 56 that extend past one end of the flat cable 32 (see FIG. 3). The extensions 56 are identical to other parts of the flat cable 32 (i.e. contain conductors printed in-between a pair of insulating layers), but are terminated at squib connectors 58 for attachment to airbag canisters. The squib connectors 58 are provided as convenient attachment means for the airbag canisters, but are not necessary to practice the present invention. The squib connectors 58 could be removed from the invention, and its features incorporated into the flat cable 32 and connection module 42.

Additionally, although the mounting headers 44 are shown and described as male ends of a male-female connector system, it should be understood that female mounting headers can be attached to the flat cable 32 without departing from the scope of the invention, so long as the contacts 54 of mounting headers 44 are directly connected to the conductors 46 of the flat cable 32.

FIG. 7 shows a second embodiment of the termination structure of the present invention, using a through-hole mounting header 60. Here, the conductors 46 of the flat cable 32 are terminated at apertures 62 ringed by an electrically conductive material. The mounting header 60 includes a mounting block 64 having a plurality of conductors 66 inserted therein, with the conductors 66 being inserted through and secured to the apertures 62, preferably by soldering the conductors 66 to the apertures 62.

Although preferred embodiments are specifically illustrated and described herein, it should be appreciated that the structure disclosed above may be modified and varied without departing from the spirit or scope of the invention.

The invention claimed is:

1. A flexible flat cable for use in a clockspring, the flat cable comprising:
    a series of parallel spaced conductors placed between a pair of insulating layers so that a thin layer of conductive material resides on an interior surface of the one of the insulating layers, wherein the conductors are printed onto one of the insulating layers, thereby defining a high density of conductors with respect to the pair of insulating layers, the high density of conductors including at least 15 conductors;
    at least one end of the cable having the insulating layer partially removed and exposing the conductors; and
    a mounting header having contacts attached to ends of the conductors, the mounting header being received in a connection module of a housing of the clockspring for electrical connection to other components.

2. The flexible flat cable of claim 1, wherein
    the contacts on the mounting header are curved to provide a larger surface area for connection to the conductors in the flat cable.

3. The flexible flat cable of claim 2, wherein
    the conductors in the flat cable are terminated at pads which are soldered to the contacts on the mounting header.

4. The flexible flat cable of claim 1, wherein the contacts on the mounting header are straight and are inserted through circular apertures on the flat cable and secured to the circular apertures for electrical connection to the conductors thereon.

5. A clockspring for a vehicle comprising;
    a housing having a connection module;
    a flexible flat cable having a series of parallel spaced conductors placed in between a pair of insulating layers, wherein the conductors are printed onto one of the insulating layers so that a thin layer of conductive material resides on an interior surface of the one of the insulating layers, thereby defining a high density of conductors with respect to the pair of insulating layers, the high density of conductors including at least 15 conductors
    at least one end of the cable having the insulating layer partially removed and exposing the conductors therein; and
    a mounting header having contacts attached to ends of the conductors, the mounting header being received in a connection module of a housing of the clockspring for electrical connection to other components.

6. The clockspring of claim 5, wherein
    the contacts on the mounting header are curved to provide a larger surface area for connection to the conductors in the flat cable.

7. The clockspring of claim 6, wherein
    the conductors in the flat cable are soldered to the contacts on the mounting header.

8. The clockspring of claim 5, wherein
    the contacts on the mounting header are straight and are inserted through circular apertures on the flat cable and secured to the circular apertures for electrical connection to the conductors thereon.

9. The clockspring of claim 5, wherein
    the mounting header is located on an intermediate portion of the flat cable, and the flat cable further includes two extensions having connectors on the ends thereof for attachment to airbag canisters.

* * * * *